United States Patent [19]

Platzoeder et al.

[11] 3,877,061

[45] Apr. 8, 1975

[54] SEMICONDUCTOR COMPONENT WITH MIXED ALUMINUM SILVER ELECTRODE

[75] Inventors: Karl Platzoeder; Alfred Porst, both of Munich, Germany

[73] Assignee: Siemens Aktiengesellschaft, Berlin & Munich, Germany

[22] Filed: Sept. 28, 1973

[21] Appl. No.: 401,705

Related U.S. Application Data

[63] Continuation-in-part of Ser. No. 249,126, May 1, 1972, abandoned.

[30] Foreign Application Priority Data

May 6, 1971 Germany ............................ 2122487

[52] U.S. Cl. ........................ 357/67; 357/67; 357/68; 357/71

[51] Int. Cl. ................................................ H01l 5/00

[58] Field of Search ....................................... 317/234

[56] References Cited

UNITED STATES PATENTS

| | | | |
|---|---|---|---|
| 3,492,546 | 1/1970 | Rosvold | 317/234 |
| 3,501,681 | 3/1970 | Weir | 317/234 |
| 3,513,361 | 5/1970 | Meyerhoff et al. | 317/234 |
| 3,639,811 | 2/1972 | Schroeder | 317/234 |
| 3,716,765 | 2/1973 | Rueffer et al. | 317/234 |

*Primary Examiner*—Michael J. Lynch
*Assistant Examiner*—E. Wojciechowicz
*Attorney, Agent, or Firm*—Hill, Gross, Simpson, Van Santen, Steadman, Chiara & Simpson

[57] ABSTRACT

This invention provides a semiconductor component which includes a semiconductor element comprising a silicon semiconductor member having several zones of alternating conductivity with at least one of the outer zones being doped by diffusion, at least one aluminum electrode arranged on the doped outer zone, and a mixed aluminum/silver electrode on the aluminum electrode.

5 Claims, 8 Drawing Figures

SEMICONDUCTOR COMPONENT WITH MIXED ALUMINUM SILVER ELECTRODE

This application is a continuation-in-part of Ser. No. 249,126, filed May 1, 1972, and now abandoned.

BACKGROUND OF THE INVENTION

Semiconductor components are known which include a semiconductor member comprised of doped silicon having deposited onto an outer zone thereof an aluminum layer or coating which serves as an emitter electrode. Although the aluminum layer is desirable, it has the disadvantageous characteristic of inherently forming an oxide layer thereon when exposed to, or in contact with, air. This oxide layer thicken gradually and increases the thermal and electrical transition resistance between aluminum of the electrode and the supply or feed electrodes which are in contact therewith to provide for supplying a current and for cooling the electrode. This oxide layer is particularly significant in the case of semiconductor components positioned between the pressure contacts which can comparatively result in greater loss of performance than with non pressurized aluminum electrodes. For example, when a pressurized component is heated, e.g. in the case of a thyristor, this oxidizing characteristic of aluminum electrodes can result in serious instabilities of the forward characteristics.

Accordingly, it would be an advance in the art if a means or process were developed for making a semiconductor member as described above where the oxidation of the aluminum electrode is obviated or at least lessened.

SUMMARY OF THE INVENTION

There has now been discovered a semiconductor component which includes in addition to a semiconductor member an aluminum electrode which has no associated oxidation layer. Such semiconductor component includes a semiconductor element comprising a semiconductor member having several zones of alternating conductivity extending from a central region thereof outwardly with at least one of said zones being doped by diffusion, and at least one of said diffusion doped zones comprising a surface zone of said semiconductor member. At least one aluminum electrode on the doped outer zone, has thereon a layer of silver mixed with aluminum. The silver layer contains aluminum in at least its surface regions adjacent the aluminum layer. Such establishes a good connection between the silver layer and the adjacent aluminum layer.

The effect of the aluminum content in the silver layer is to avoid a growing together of the aluminum layer with the silver layer of the supply electrode independently of the type of operation to which the semiconductor component is subjected (e.g. a continuous load or alternating load), even under pressurized electrodes. Simultaneously also, an oxidation of the aluminum electrode is avoided by reason of the low percentage of aluminum adjacently contained in the adjoining silver layer.

It, therefore, is an object of the present invention to provide a semiconductor component having an aluminum electrode with a layer of aluminum modified silver thereon.

Another object of the present invention is to provide simple but efficient methods for producing a semiconductor component having an aluminum electrode with a layer of aluminum modified silver thereon.

Other and further aims, objects, features and advantages of the invention will be readily apparent from the following description of preferred embodiments thereof, taken in conjunction with the accompanying drawings, although variations and modifications may be effected without departing from the spirit and scope of the novel concepts of the disclosure.

DESCRIPTION OF THE PREFERRED EMBODIMENTS

Figure 1:
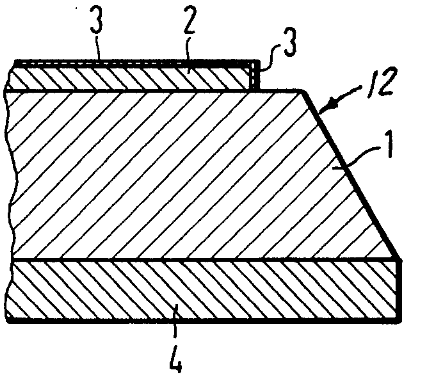
FIG. 1 is a partial, sectional view of an embodiment of a semiconductor element according to the present invention.
Figure 7:
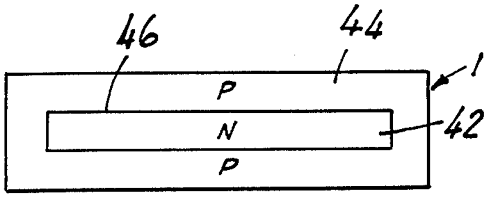
FIG. 7 is a plan view of a semiconductor member of the present invention, illustrating its zones of alternating conductivity.
Figure 8:
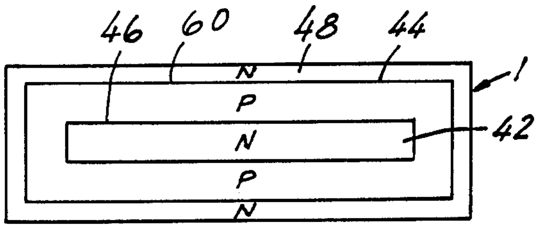
FIG. 8 is a plan view of a modification of the semiconductor member shown in FIG. 7.

Referring to FIG. 1, there is shown an embodiment of a semiconductor component or element of this invention indicated in its entirety by the reference numeral 12. The semiconductor element 12 comprises a semiconductor member 1 preferably made of silicon and having several zones of alternating conductivity extending from a central region thereof outwardly as illustrated in FIGS. 7 and 8. On one side of the semiconductor member 1 there is provided an aluminum electrode 2 which has adhered thereto a layer 3 of silver which has been modified with aluminum. On the other side of the semiconductor member 1 there is provided a second electrode member such as a carrier plate 4 which most preferably consists of a material having a thermal coefficient of expansion similar, or equal to that of silicon. Such a carrier plate material is preferably molybdenum. The semiconductor element 12 accordingly is formed by the semiconductor member 1, the aluminum electrode 2, the layer 3 on the electrode, and the molybdenum carrier plate 4.

Figure 2:
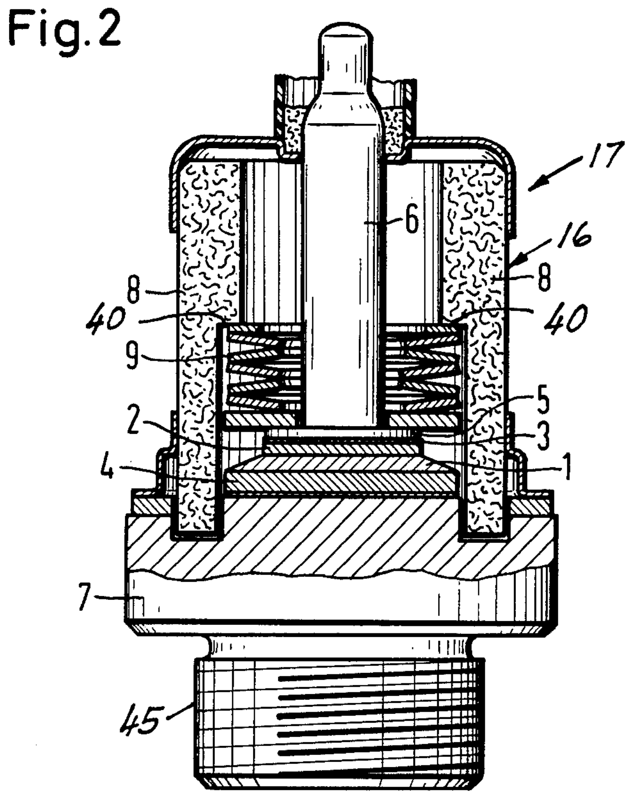
FIG. 2 is an elevated, partial cross-sectional view of a semiconductor component according to the present invention, illustrating the arrangement therein of the semiconductor element shown in FIG. 1.

In FIG. 2 there is illustrated an embodiment of a semiconductor device of this invention which is designated in its entirety by the numeral 17. Device 17 has the semiconductor element 12, shown in FIG. 1, incorporated thereinto. Thus, the semiconductor element 12 is mounted under pressure between a supply electrode 5 and a base plate 7 in a housing 16. A plurality of springs 9 provide the desired contact pressure between the semiconductor element 12 and the electrode 5 and base plate 7, and are supported by an abutment 40 formed in a wall 8 of the housing 16. Typical contact pressures range from about 100 to 500 kg/cm$^2$ upon the electrodes of a semiconductor element 12. The wall 8 of the housing 16 is rigidly connected with the base plate 7 as by a welded sleeve 10. The supply electrode 5 is provided with a feed line 6 which leads through the springs 9. The supply electrode 5, the feed line 6 and the base plate 7 serve the dual purpose of supplying and/or discharging a current of electricity to semiconductor element 12 and of discharging or conducting away the heat generated by the energy loss from the electrode 2 which develops during the operation of the device 17.

In producing the semiconductor element 12; it is preferred to form the aluminum electrode 2 by vapor depositing aluminum in a vacuum, onto the surface of the semiconductor member 1. In order to avoid the formation of an oxide layer or film on the aluminum electrode 2, a layer 3 comprised of silver can be vacuum vapordeposited directly onto the aluminum electrode 2 immediately after the aluminum electrode has been deposited. After being vapordeposited, the layer of silver is sintered onto the electrode 2 at a temperature ranging between about 200° and 550°C., preferably from about 300° to 500°C., and most preferably at a temperature of about 450°C for times ranging from about 5 to 20 minutes. By this process, a good adhesion of the silver to the aluminum is obtained, as well as a good adhesion of the aluminum to the silicon. During the sintering, the aluminum tends to migrate into the silver and vice versa.

The aluminum content of a resulting aluminum modified silver layer prevents a growing together of this electrode with the supply electrode under all operating conditions. Simulataneously, oxidation of the aluminum contact surface is eliminated.

Figure 3:
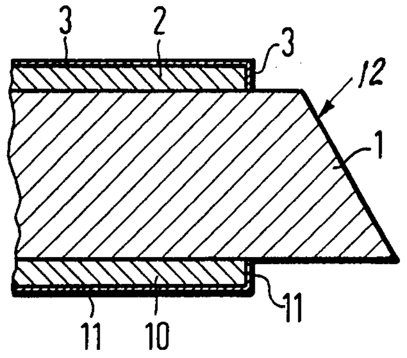
FIG. 3 is a partial, cross-sectional view of a second embodiment of the semiconductor element illustrated in FIG. 1.

On the other side of the semiconductor member 1, a molybdenum carrier plate 4 can be provided. However, as illustrated in the alternative embodiment of FIG. 3, the carrier plate 4 of molybdenum on the semiconductor member 12 may be replaced by aluminum electrode 10 having thereon a layer 11 of silver, prepared preferably as above indicated.

Figure 4:
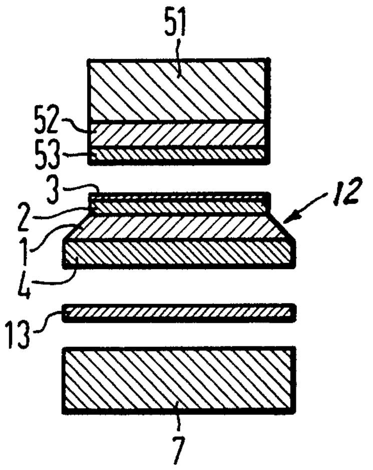
FIG. 4 is an exploded sectional view of the individual layers of electrodes and supply electrodes of the semiconductor component shown in FIG. 2.
Figure 5:
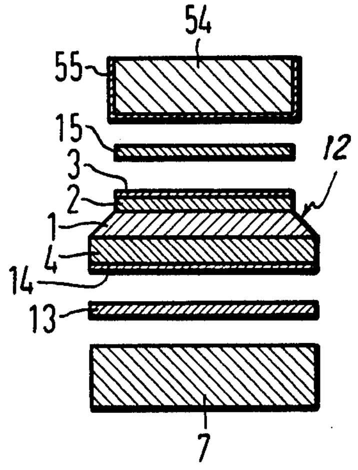
FIG. 5 is an exploded sectional view of another embodiment of the layers of the electrodes and supply electrodes of the semiconductor component shown in FIG. 2.

In FIGS. 4 and 5, there are shown two embodiments for sequences of a layer structure for metals which constitute the electrodes or supply electrodes, respectively, of the semiconductor component 17 as shown in FIG. 2. In FIG. 4, the supply electrode 5 of FIG. 2 consists of a copper layer 51, a molybdenum layer 52, and a silver layer 53. These three layers are bonded together, for example, by means of soldering. Because of the similar thermal coefficient of expansion of both the conductor member 1 and the molybdenum layer 52 of the supply electrode, a different expansion of the supply electrode and semiconductor element is avoided during the operation of the semiconductor component 17. This insures that the contact between the supply electrode and the semiconductor element is maintained. The base plate 7 shown in FIG. 4 is preferably made of copper. A foil 13 is arranged between the molybdenum carrier plate 4 and the base plate 7 which can consist of silver and have a thickness of approximately 200 microns. Since the molybdenum and silver do not alloy with one another under the operating conditions of the semiconductor component 17, the base plate 7, which shows a substantially higher coefficient of expansion than the semiconductor element 12, can move easily with respect to the semiconductor element, i.e., the base plate can slide over the semiconductor element. Thus, the good contact between the carrier plate 4 and the base plate 7 is maintained because of the influence of the springs 9 during the operation of the semiconductor component 17.

In FIG. 5, there is another embodiment of a sequence of layers of metals. The supply electrode 5 in this embodiment consists of a member 54 made of copper, which is provided with a layer of nickel 55. A silver foil 15 of approximately 50 microns is arranged between the nickel layer 55 and the semiconductor element 12. Since nickel does not form an alloy with silver under the operating conditions of the component 17, the thermal stresses which might, for example, destroy a soldered or alloyed contact cannot develop between the supply electrode and the semiconductor element 12. The bottom side of the carrier plate 4 of the semiconductor element 12 is provided with a silver layer 14 protecting the carrier plate 4 against oxidation. As provided in the assembly of metal layers in FIG. 4, a silver foil 13, having a thickness of approximately 200 microns, is placed between the silver-plated carrier plate 4 and the copper base plate 7. During the operation of the semiconductor component 17, the silver layer 14 and the silver foil 13 fuse together. The different coefficients of expansion of the base plate 7 and the semiconductor element 12 do not have an adverse effect during electrical load changes, since under the operating conditions of the semiconductor component 17, the silver rarely forms an alloy with the copper. If, however, there is an alloy formed, the carrier plate 4 forms an effective mechanical protection against thermal stresses in the semiconductor element.

In each of FIGS. 7 and 8, there is illustrated an embodiment, respectively, of the semiconductor member 1. The embodiment shown in FIG. 7 has zones of alternating conductivity including an n-conductive zone 42 which may consist of a mono-crystalline silicon, germanium or silicon carbide. However, the use of a mono-crystalline silicon is preferable. The n-conductive zone 42 is completely surrounded by a p-conductive zone 44 and between these two zones there is a pn-junction 46. The outer zone 44 has an n-doped material diffused on its outer surface. The materials that may be diffused onto the outer zone 44 includes phosphorous, arsenic, antimony and the like. The use of phosphorous particularly has provided very good results.

In the embodiment shown in FIG. 8, the semiconductor member 1 has an outer n-doped zone 48. This can be provided by first forming a layer or cover, for example, of phosphorous, on the surface of the semiconductor member 1 as shown in FIG. 7. Then, the semiconductor member 1 with this cover may be heated at a high temperature, such as from 1,100° to 1,300°C., for a sufficient period of time whereby the layer of phosphorous is diffused in the semiconductor member to form the outer, n-doped zone 48. A pn-junction 60 forms between this outer zone 48 and the adjacent p-doped zone 46.

Figure 6:
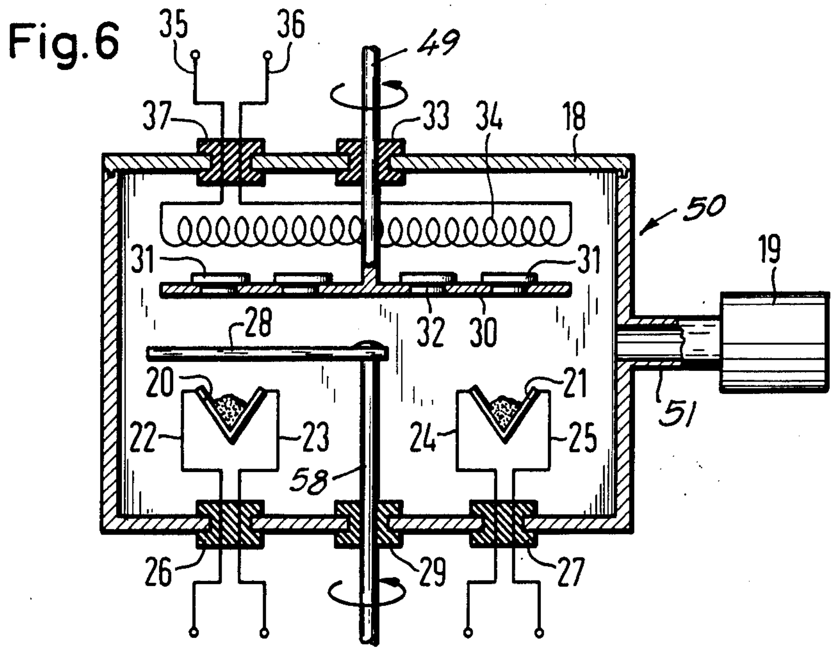
FIG. 6 is an elevated, partial cross-sectional view of a vacuum chamber for producing electrodes for the semiconductor components according to the present invention.

In FIG. 6 there is shown a vacuum container or chamber 50 suitable for producing the aluminum electrode 2 and for forming the silver layer 3 thereon, according to the present invention. As shown, the vacuum in the container 50 is produced by a vacuum pump 19 connected thereto by a tube 51. The chamber 50 includes two bins 20 and 21 which, respectively, contain silver and aluminum. The bins are connected by means of supply lines 22, 23, 24 and 25 with voltage sources (not shown). The supply lines are directed through the housings 18 of the vacuum container 50 by means of gas-tight passages 26 and 27. A shutter 28 is provided which is pivotally mounted within the container 50 on a shaft 58 extending to the outside of the container by means of a passage 29. In the container, a series of semiconductor members 31 are supported on a carrier 30. The carrier which is mounted on a shaft 49 is provided with openings 32 through which aluminum and silver vapors pass, respectively, from bins 21 and 20 to contact the semiconductor members 31. The carrier 30 is pivoted by means of the shaft 49 which is extended outside of the vacuum chamber 50 through a vacuum-tight passage 33. A filament winding 34 is arranged above the carrier 30 with supply lines 35 and 36 being connected to a voltage source (not shown). The supply lines extend from the filament winding 34 through the housing 18 of the container 50 by means of a vacuum-tight passage 37.

In the operation of the vacuum container 50 for forming electrodes 2 on the semiconductor members 31, the bin 21 containing aluminum is first heated. This heating causes the aluminum to vaporize and pass through the openings 32 to deposit a layer of aluminum on the bottom surfaces of the semiconductor members 31. During this process the shutter 28 covers the bin 20 which is filled with silver, thus preventing the deposition of the silver with the aluminum onto the semiconductor members 31. When a sufficient layer thickness of aluminum is obtained, the bin 21 is no longer heated and the shutter 28 is turned or pivoted toward the right over bin 21 and the bin 20 is then immediately heated. This causes the silver contained in the bin 20 to vaporize and deposit a silver layer on the aluminum layer already deposited on the semiconductor 31. The vapor depositing process is interrupted when a layer of silver of a thickness of between 0.5 and 10.0 microns has been deposited on the aluminum. The silver layer is then sintered onto the aluminum layer, using conditions as above indicated. For example, for this purpose, the filament winding 34 is heated to a sufficiently high temperature to heat the semiconductor members 31 with the silver on the aluminum to a temperature of approximately 450°C. This provides the aluminum layer with a layer of sintered silver.

If one of the electrodes consists of a molybdenum plate, it may be silver-plated subsequent to the aluminum electrode in order to prevent the formation thereon of an oxidation layer. This may, for example, be carried out by means of a holder which is arranged in a tiltable manner, whereby the aluminum electrode is first turned and thereafter the molybdenum plate to face the silver-vaporizing bin 20. Subsequently, the silver layers are sintered, respectively, onto the underlying aluminum and molybdenum layers.

For example, referring to FIGS. 1 and 2, a semiconductor element 12 and a member 1 can have a thickness in the range from about 100 to 1,500 microns, an aluminum electrode 2 can have a thickness in the range from about 5 to 50 microns, a silver layer 3 modified with aluminum can have a thickness of from about 0.05 to 10 microns, a carrier plate 4 can have a thickness of from about 0.3 to 5 millimeters, an electrode 10 can have a thickness of from about 5 to 50 microns, and a silver layer 11 duly modified with aluminum can have a thickness of from about 0.05 to 10 microns.

A semiconductor component of this invention preferably has at least one aluminum contact electrode with a layer of the aluminum modified silver.

In general, in the present invention, the layer comprised of silver is formed in face-to-face engagement over at least a portion of an exposed, surface of at least one of the aluminum contact electrodes, and this layer is positioned thereon in generally opposed relationship to a semiconductor member. The silver in this layer is mixed with aluminum at least in the portion of said silver in said layer adjacent said first electrode. The total aluminum silver layer is less than about 20 weight percent of total the combined weight of aluminum and silver therein on a 100 weight percent total layer weight basis. If the aluminum content is further increased beyond such 20 percent value, it is possible for deteriorations of the contact characteristics due to oxidation of the aluminum will occur. In that case the forward resistance of a semiconductor element in which such a contact is used becomes excessively high.

An aluminum content can be recognized in a silver layer containing aluminum by a metallic grey appearance at the surface. Contrary thereto, a pure silver layer looks white-yellowish at the surface.

While the aluminum contents desired in a silver layer can be produced by sintering as taught herein, there are other methods by which such a content may be established. For example, a suitable aluminum modified silver layer is readily produced by the simultaneous evaporation of silver and aluminum from separate evaporators directly onto the aluminum electrode.

What is claimed is:

1. A semiconductor component adapted for mounting between a pair of pressurized supply electrodes comprising:

A. a semiconductor member comprised of silicon and having several zones of alternating conductivity extending from a central region thereof outwardly, at least one of said zones being doped by diffusion, one of said diffusion doped zones comprising a surface zone of said semiconductor member, B. at least one first electrode comprised of aluminum, each such electrode being formed in face-to-face adhering engagement over at least a portion of the exposed face of said surface zone, C. a second electrode comprised of a material selected from the group consisting of molybdenum and tungsten and having a linear thermal coefficient of expansion about equal to that of said semiconductor member, said second electrode being formed in face-to-face adhering engagement over at least a portion of an exposed face of said semiconductor member but in generally opposed relationship to one of said supply electrodes, D. a layer comprised of silver and aluminum formed in face-to-face adhering engagement over at least a portion of an exposed surface of at least one of said first electrodes, said layer being positioned thereon in generally opposed relationship to said semiconductor member, said silver and said aluminum being mixed together with aluminum being present in silver at least in the portion of said layer which lies adjacent one of said supply electrodes, the total aluminum content of said layer being less than about 20 weight percent of the total combined weight of aluminum and silver therein on a 100 weight percent total layer weight basis.

2. The semiconductor component of claim 1, having at least one first electrode each with a said layer thereon.

3. The semiconductor component of claim 1 wherein said second electrode consists of molybdenum or tungsten.

4. The semiconductor component of claim 3, wherein said molybdenum plate is silver-plated on its exposed side.

5. The semiconductor component of claim 1, wherein the thickness of said silver layer is between about 0.05 and 10 microns.

* * * * *